United States Patent [19]

Turner

[11] Patent Number: 5,432,437
[45] Date of Patent: Jul. 11, 1995

[54] EXPOSURE METER FOR USE WITH INDICTION HEAT SEALING OF CONTAINERS

[75] Inventor: Peter G. Turner, Vinkeveen, Netherlands

[73] Assignee: Koninklijke Emballage Industrie Van Leer B.V., Amsterdam, Netherlands

[21] Appl. No.: 211,613

[22] PCT Filed: Oct. 9, 1992

[86] PCT. No.: PCT/NC92/00181

§ 371 Date: Jun. 13, 1994

§ 102(e) Date: Jun. 13, 1994

[87] PCT Pub. No.: WO93/07504

PCT Pub. Date: Apr. 15, 1993

[30] Foreign Application Priority Data

Oct. 11, 1991 [EP] European Pat. Off. .......... 91202647

[51] Int. Cl.6 ........................................... G01R 33/28
[52] U.S. Cl. ...................................... 324/95; 324/202; 73/52; 73/49.3
[58] Field of Search ..................... 73/52, 49.3, 1 R; 324/95, 202

[56] References Cited

U.S. PATENT DOCUMENTS 3,604,882  9/1971  Seyfried .
3,914,689  10/1975  Wright .
4,634,969  1/1987  Edlin et al. .
4,659,984  4/1987  Doss .
4,684,554  8/1987  Ou-Yang .

FOREIGN PATENT DOCUMENTS 2352305  12/1977  France .
WO82/02593  8/1982  WIPO .

OTHER PUBLICATIONS

By V. Sudnik et al., "Butt Pressure Welding Machine", Soviet Inventions Illustrated, Jun. 1970, SU 396,220, vol. V, No. 23.

Primary Examiner—Kenneth A. Wieder
Assistant Examiner—Mark A. Wardas
Attorney, Agent, or Firm—Young & Thompson

[57] ABSTRACT

A high frequency magnetic field exposure meter for use in an induction heat sealing operation for heat sealing metal foil elements in closures to containers to be closed by the closures. The meter has a magnetic field sensing coil, a rectifier to convert the a.c. output from the coil to a d.c. output, an integrating circuit to integrate the d.c. output over an exposure period to an h.f. magnetic field, and a display device to indicate the integrated exposure value generated by the integrating circuit. During operation, the meter generates a quantitative reading indicating exposure to the h.f. magnetic flux as an integral of the magnetic flux, which generates the induction heating currents, over the exposure period during the induction heat sealing operation, and the reading provides a useful measure of the induction heating generated in an induction heat sealable closure.

10 Claims, 8 Drawing Sheets

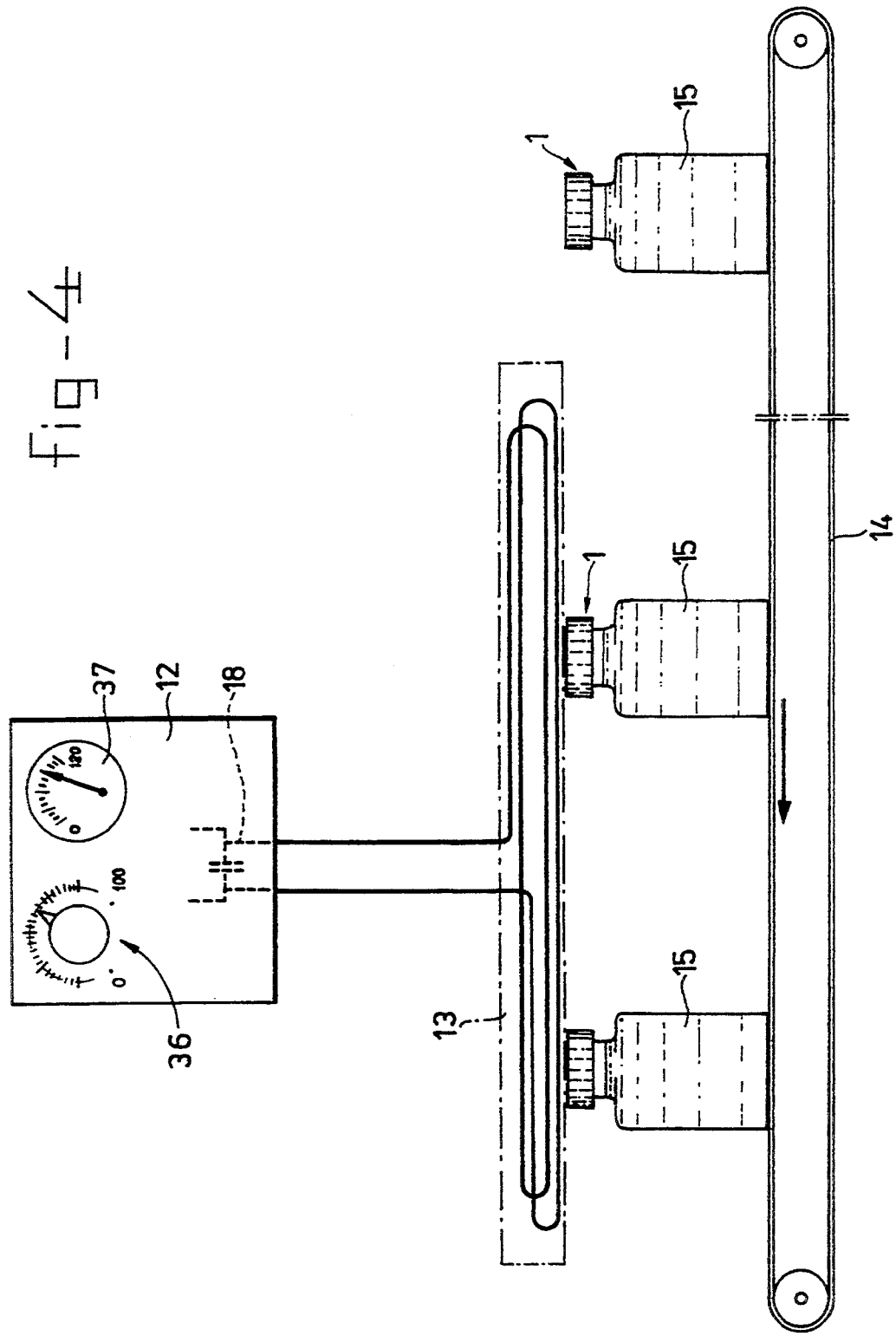

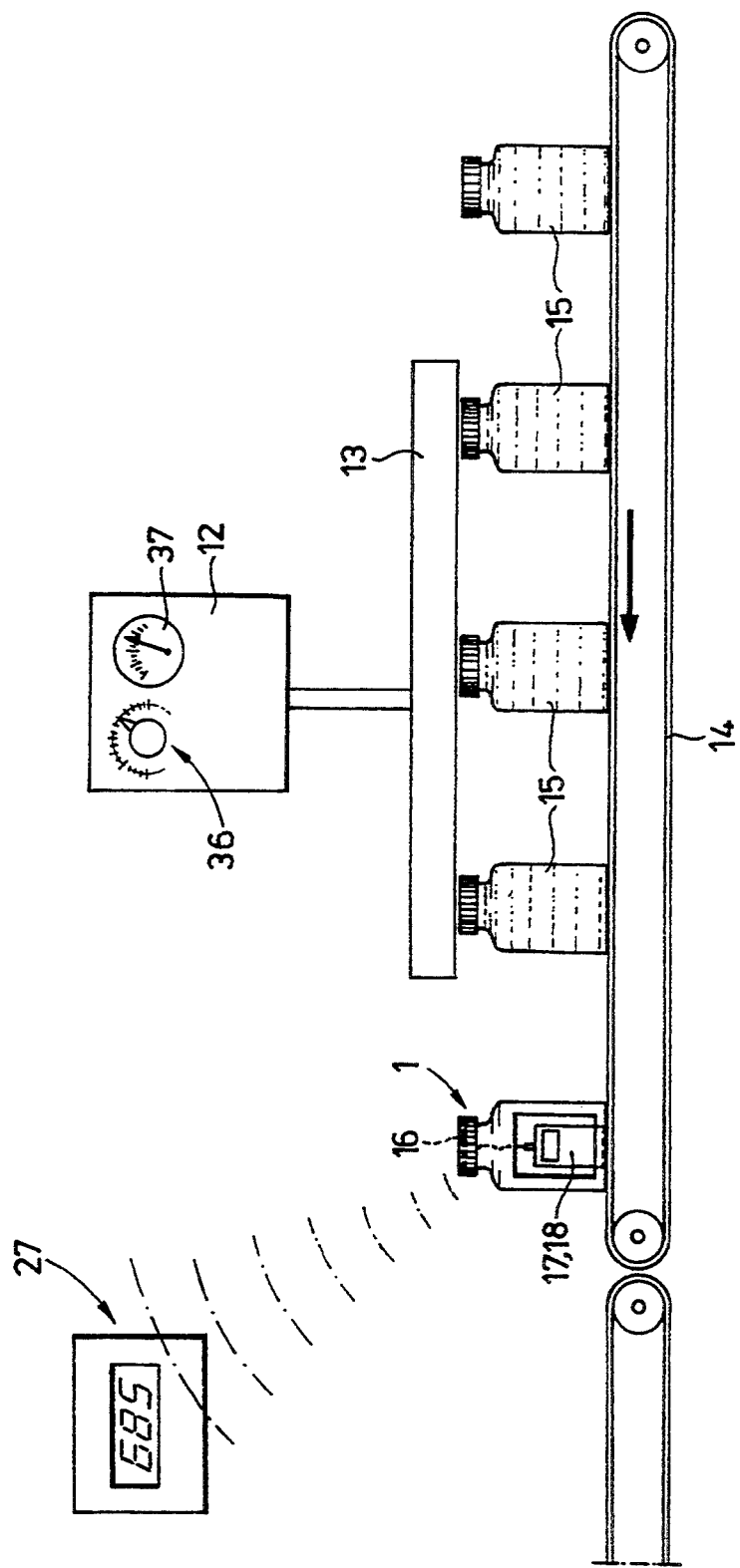

EXPOSURE METER FOR USE WITH INDICTION HEAT SEALING OF CONTAINERS

The invention relates to a high frequency magnetic field exposure meter for use in an induction heat sealing process for heat sealing the metal foil wad elements in a closure to a container to be closed by said closure, during which operation each closure passes beneath an induction coil of an induction heat sealing apparatus.

Heat sealing processes of the above indicated type are well-known in the industry and are used to tightly close containers of different type, for instance in the food processing industry, in the pharmaceutical industry, etc.

Before describing the invention in detail, it is first necessary to understand the induction heat sealing process as used for sealing foil membranes across the openings of non-metallic bottles, jars and containers.

Induction heat sealing is a long established technique well known to those in the field of packaging. The system is explained by reference to FIGS. 1, 2 and 3 which show closures and FIGS. 4 and 5 showing the induction sealing operation.

FIG. 1 shows a section through a plastic closure (1) which comprises a body (2), which is screw-on (as shown) or snap-on, and an internal wad (3), which, on a conventional closure, forms the sealing surface with the neck of the container (4).

FIG. 2 shows cross-sections through different wads, comparing the constructions used in conventional (no induction heat-seal) wads in FIG. 2(a) with that of induction heat-sealable wads in FIG. 2(b). In FIG. 2, (5) represents the main component of the wad, a paper, paperboard, or sometimes plastic or foamed plastic disc. For wet products, the paper-based wads are bonded by an adhesive layer (6) to a water-(or product-) resistant plastic film (7).

For induction heat sealable wads, shown in FIG. 2(b), this conventional structure is bonded by a wax layer (8), which may be continuous, in a grid pattern or in a dot pattern, to a second structure comprising the laminate (9), (10), (11). Layer (9) is a paper layer designed to be able to absorb the wax layer when it is melted during induction heat sealing. Layer (10) is an aluminum foil in which electrical currents are induced during the induction heat sealing process, and which forms the eventual foil membrane across the neck of the bottle, and layer (11) is a heat sealable plastic layer or adhesive layer selected for compatibility with the material of the (non-metallic) bottleneck (4).

After the correct exposure under an induction coil, the heat generated by the currents induced in the foil (10) melt and bond the plastic layer (11) to the rim of the bottle (4), and melt the wax layer (8) allowing it to be absorbed into the paper layer (9) so that the wax no longer bonds the upper part of the wad (5, 6, 7) to the lower foil membrane part of the wad (9, 10, 11), FIG. 3 illustrates the situation after successful induction heat sealing when the closure (1) is removed from the container (4). The conventional wad.(3) comprising layers (5),(6),(7) remains still attached to the closure body (2), leaving the foil (10) (still sandwiched between layers (9) and (11)) bonded as a seal across the neck of the container (4). The foil seal provides a second and high integrity closing system for the bottle, and provides tamper evidence required by many products.

Examples of the use of this type of induction heat sealing are to be found in pharmaceuticals, oil products, chemicals, and milk and fruit juice containers.

The induction sealing equipment is illustrated schematically in FIG. 4. Typically it comprises a mains voltage driven power supply (12) which generates high frequency currents which are fed to the induction coil (13), which is mounted over a conveyor (14) which transports the filled containers (15), with the pre-applied induction heat seal closures (1) beneath the coil (13). The power supply has a power controller shown by (16) and an output power indicator shown by (17). Basically the power supply unit generates a resonant high frequency, high current between an internal capacitor, shown as (18), and the inductance of the induction coil (13). The high current in the coil generates a strong magnetic field, also oscillating at the same high frequency as the supply current. This is typically in the range of a few tens of kilohertz to a few thousand kilohertz (i.e. megahertz). It is this high frequency magnetic field which, in passing through the foil membrane (10) in the closure cap (1), generates the induced currents which cause the heat sealing.

FIG. 5 shown a transverse section across an induction coil (13) and a bottle (4) and closure (1) indicating how the lines of magnetic field generated by the current in the coil interact with wad (3) containing the foil membrane. A section through two windings is shown, two with current out of page (left) and two with the current into page (right).

The magnitude of the currents induced in the foil membrane is directly dependent on the magnitude of the high frequency magnetic flux passing through the foil membrane, according to well established electrical theory. The magnetic flux determines the heating power, and the integral of this magnetic flux-over the complete exposure period, as the work is transported under the coil, determines the total heat energy generated in the coil.

It is important that the exposure of the work under the coil, i.e. the integral of magnetic flux over the exposure period, is correct to achieve good sealing. Too low an exposure, and the seal is weak, or incomplete round the full circumference, or totally absent; and too low an exposure may mean the wax bond ((8) in FIG. 2b) is not completely melted. Too high an exposure, and excessive heat is generated causing thermal degradation of the materials of the closure, often to be seen as charting of the paper (9) or embrittlement of the plastic layer (11).

It is an ever-present problem to packagers using induction heat sealing, especially when having to change systems for different containers or closures, to re-establish the correct exposure conditions. Traditionally this has always been a trial and error process because the quality of the seal cannot be judged until the outer cap (1) is removed to allow a visual inspection. If the closure has additionally a tamper-evident ring, the ring is broken, and, even if the seal is good, the package must be rejected involving product waste and loss of efficiency in the filling operation.

The correct exposure is found by a combination of adjustments: to the speed of the conveyor (14), which controls the time element of the exposure; to the power setting (16) on the supply to the coil (13), which controls the strength of the high frequency magnetic field generated by the coil; and to the vertical spacing between the coil (13) and the foil layers (10) in the bottle closures (1) as they are transported under the induction coil. With often no indication of conveyor speed, only poor and indirect indication of the current to the induction coil, and physical difficulties in measuring vertical spacings in a production environment, packagers using induction heat sealing usually need to go through the time-consuming and wasteful process of trial-and-error each time a change is made in the filling operations.

Furthermore, motor speeds and power outputs may drift during the course of production runs leading to the formation of poor seals, detectable only by removing the main closure (1).

The position of the metal foil insert relative to the induction coil is very critical in determining the exposure to the high frequency magnetic field generated by the induction coil. In FIG. 5, the magnetic flux, i.e. the total number of magnetic lines of force passing through the wad (3) can be seen to increase sharply as the vertical spacing decreases, and decrease as the spacing increases. These differences are further accentuated because, although the voltages induced in the metal foils are directly proportional to the high frequency magnetic flux passing through the foil, the heat produced is proportional to the square of the voltage and thus to the square of the h.f. magnetic flux. Thus relatively small variations in vertical position can have disproportionately large effects on the heating energy going into the foil (10) of the induction heat seal closures.

The object of the present invention is now to offer a means to overcome these problems.

In agreement with this object the invention provides a high frequency magnetic field exposure meter suitable for use in an induction heat sealing process for heat sealing the metal foil wad elements in a closure to a container to be closed by said closure, during which operation each closure passes beneath an induction coil of an induction heat sealing apparatus, said meter comprising:
 a magnetic field sensing coil designed to be exposed to the same h.f. magnetic flux as said metal foil wad elements of said closures receive during the induction heat sealing operation,
 a rectifier to convert the a.c. output from said coil to a d.c. output;
 an integrating circuit to accumulate said d.c. output over an exposure period equal to the exposure period in which the metal foil is sealed to the container during normal operation of the apparatus.
 a display device to indicate the accumulated value generated by the said integrating circuit.
said exposure meter during operation generates a quantitative reading indicating exposure to the h.f. magnetic flux as an integral of the magnetic flux, which generates the induction heating currents, over the exposure period during the induction heat sealing operation, said reading providing a useful measure of the induction heating generated in an induction heat sealable closure.

Once a system has been set up, by the trial and error procedure, the exposure meter according to the invention is used to measure the integrated exposure to the high frequency magnetic field which the closures receive at that setting. The exposure meter indicates, characterises and quantifies a value, or better, a working range, at which good seals are obtained. It can be used during production runs, with no interruption to production, to establish whether the running conditions have altered, and if so, used again as the settings for conveyor speed, or power, or coil height are changed in order to re-establish the preferred exposure value.

The exposure meter would also be used at the start of further production runs to re-establish the correct exposure (established by the first, and only, trial-and-error procedure) before the production filled bottles start to pass through.

The invention will now be described in more detail with reference to the attached drawings.

The attention is drawn to FR-A-2352305 which discloses a magnetic field strength meter. Such a meter is suitable for measuring instantaneous magnetic fields but does not include the means to integrate and acumulate these instantaneous values over an exposure period, in which the meter may be exposed to a non-uniform magnetic field, to obtain a cumulative exposure or dose reading.

The invention will now be described in more detail with reference to the attached drawings.

The FIGS. 1–5 are illustrating the state of the art and are already discussed above.

FIG. 13 illustrates an embodiment in which a wireless communication path is established between the display device and the remainder of the circuit.

Figure 1:
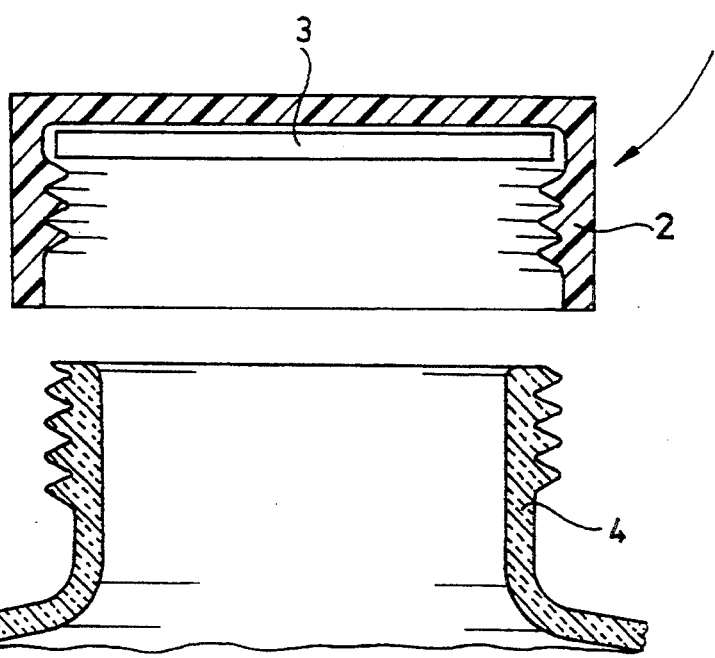
Figure 2:
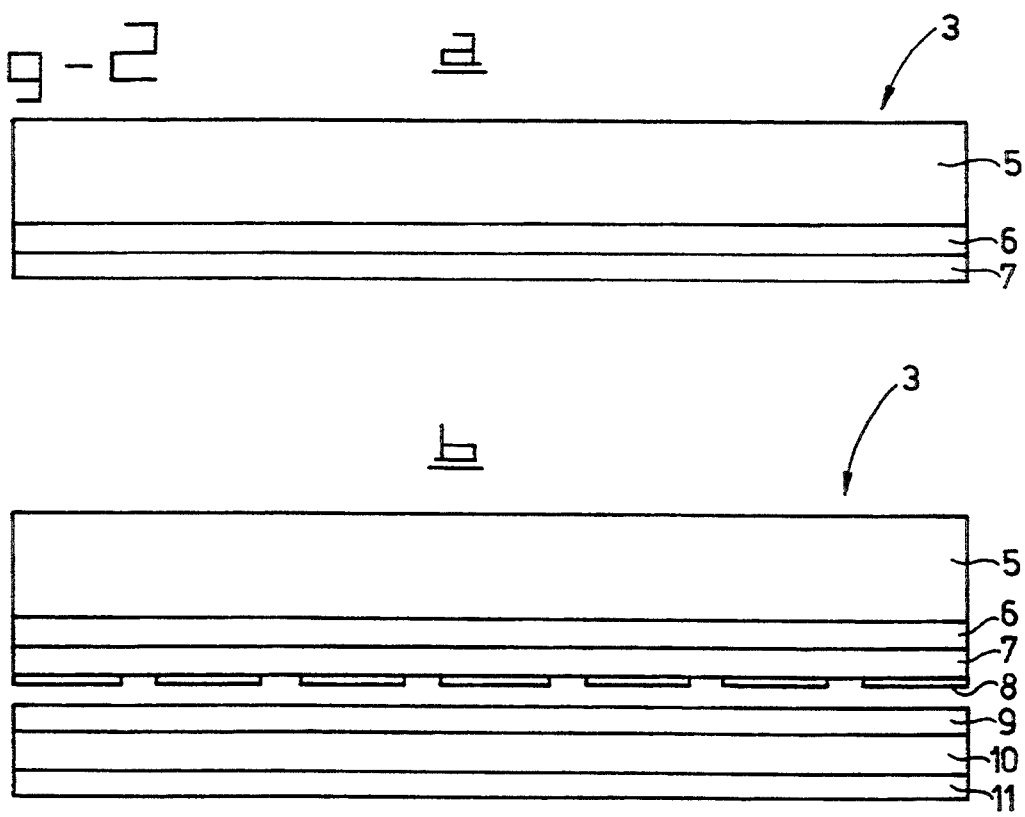
Figure 3:
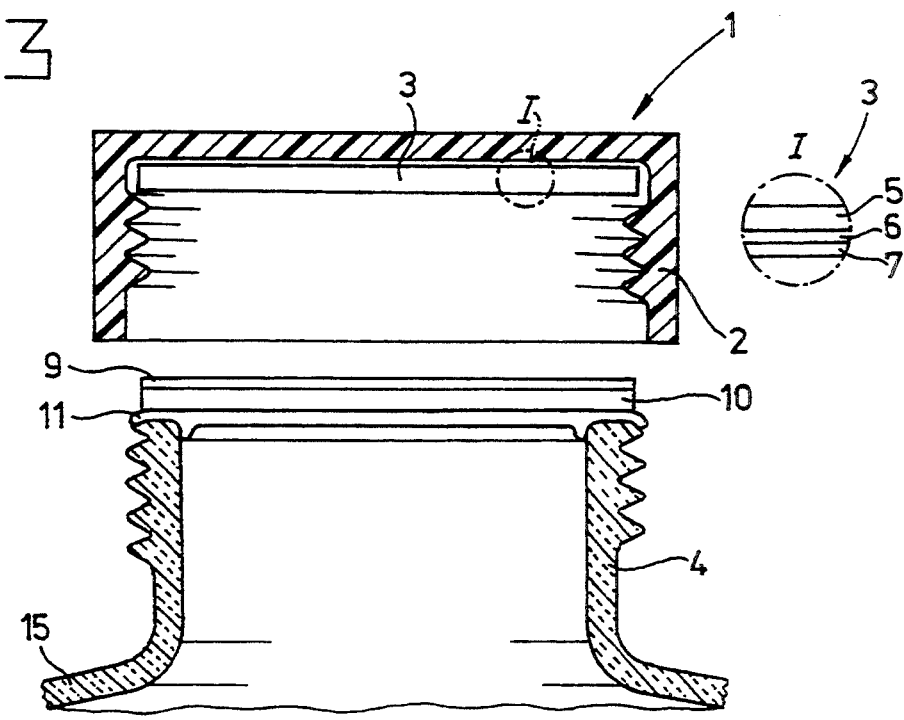
Figure 6:
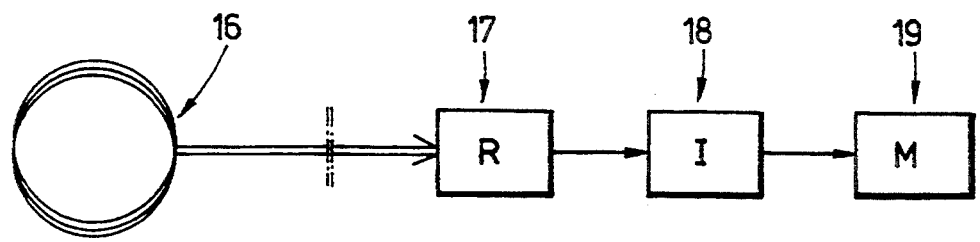
FIG. 6 shows a block diagram of an exposure meter according to the invention.

The complete exposure meter of the invention comprises 4 essential elements shown schematically in FIG. 6. In FIG. 6, (16) represents a sensing coil to respond to the high frequency magnetic flux; (17), marked R, is a rectifying device which converts the high frequency s.c. voltage from the coil (16) to d.c.; (18), marked I, is an integrating circuit which integrates the d.c. voltage from R over the period of the exposure measurement; and (19), marked M, is a meter or display device to indicate the precise magnitude of the integrated exposure.

The coil (16) is constructed so that it can effectively replace the heat sealable wad (3) in a closure (1). The outside diameter of the coil is the same as the outside diameter of the wad and the coil is mounted in the same plane as the wad it replaces and simulates. Thus the coil is exposed to precisely the same magnetic flux as a closure is when it passes under the coil.

Different sized closures would preferably have different sized test coils to match the diameters of the wads for use in the exposure measurement procedures. The number of turns in the coil is chosen so that the s.c. voltage induced in the test coil is preferably of the order of several volts to facilitate measurements in the rest of the circuit, but the invention is in no way restricted to such voltages, and those skilled in the art of electronic engineering can equally work with voltages of millivolts or hundreds of volts.

The induced voltage is proportional to the number of turns of the coil, the magnetic flux (integral of field strength over the enclosed area of the coil) and the high frequency. Thus coils for use with small closures, using foil membranes of small surface area and exposed to a low magnetic flux, would require more turns for a given output than coils to be used with larger diameter closures.

Figure 7:
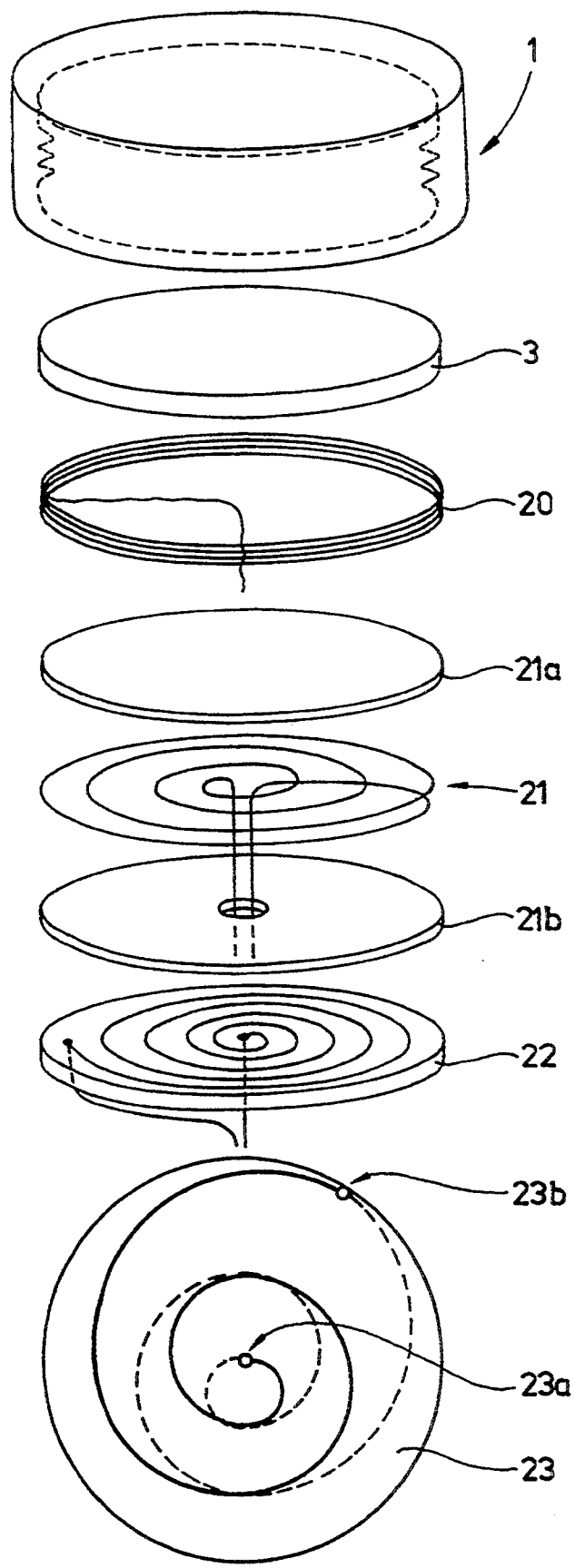
FIG. 7 shows a number of proposed coil constructions.

FIG. 7 shows a number of proposed coil constructions although the invention is not limited to the examples shown, and other constructions known to those skilled in the art which respond to the magnetic flux experienced by the closure foils are equally acceptable.

In FIG. 7, a closure (1) and wad (3) are shown to indicate the relative dimensions of the coils. (20) represents a coil of several close-packed turns of wire in a coil of the same diameter as the wad (3). (21) represents a coil wound as a planar spiral with all the turns in the same plane as a wad (3). It is shown sandwiched or bonded between supporting insulating discs (21a) and (21b), but it could equally by encapsulated in resin inside a closure (1) in place of the wad (3). (22) shows a printed circuit board with a spiral planar winding etched on one surface with central and edge connections to the coil. The coil shown in (20) could similarly be constructed as a close-packed spiral confined to the edge area of a disc shaped printed circuit board. (23) shows a top view on a preferred embodiment using a two-sided printed circuit board in which the conductor on one face, shown solid, spirals out from the centre (23a) to the edge (23b) where it makes a connection through the board to a similar spiral conductor on the reverse side which spirals back to the centre (23a) where it is connected to a connecting lead. Printed circuit boards can be rigid or flexible, the latter better simulating the thickness of the foil insert (10) of a closure wad which it simulates.

The advantage of the spiral construction is that the induced voltage is an integral of the voltage induced over the whole area of a wad, in which heat is generated, whereas the circular construction (20) measures the magnetic flux that the outside edge experiences, this being the area where heat sealing occurs.

With reference to FIG. 6, the sensing coil (16) is connected to the measuring part of the circuit.(17), (18), (19). It connects first to a rectifying circuit, (17) in FIG. 6, which converts the high frequency a.c. voltage induced in the coil to a d.c. voltage. There are many circuits known to those skilled in electronic engineering for achieving this which are applicable. Provided the voltage is well in excess of 0.6 volts (the voltage loss across a semiconductor diode), a simple silicon diode or diode bridge can be used.

The d.c. voltage from the rectifying device (17) is fed to an integrating circuit. There are many circuits possible known to those skilled in electronics which can be used. A simple integrating circuit charges a capacitor through a resistor, and, as long as the voltage built up on the capacitor remains only a small fraction of the input voltage, it provides an accurate, passive, integrating circuit. Such a circuit is shown in FIG. 8.

Figure 8:
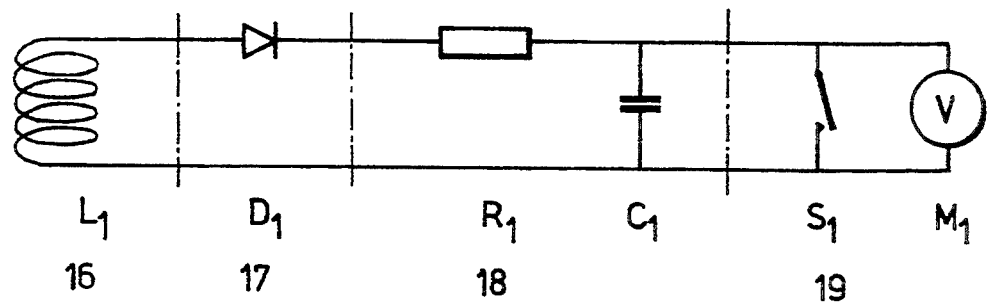
FIG. 8 shows an exposure meter comprising a very simple integrating circuit.
Figure 5:
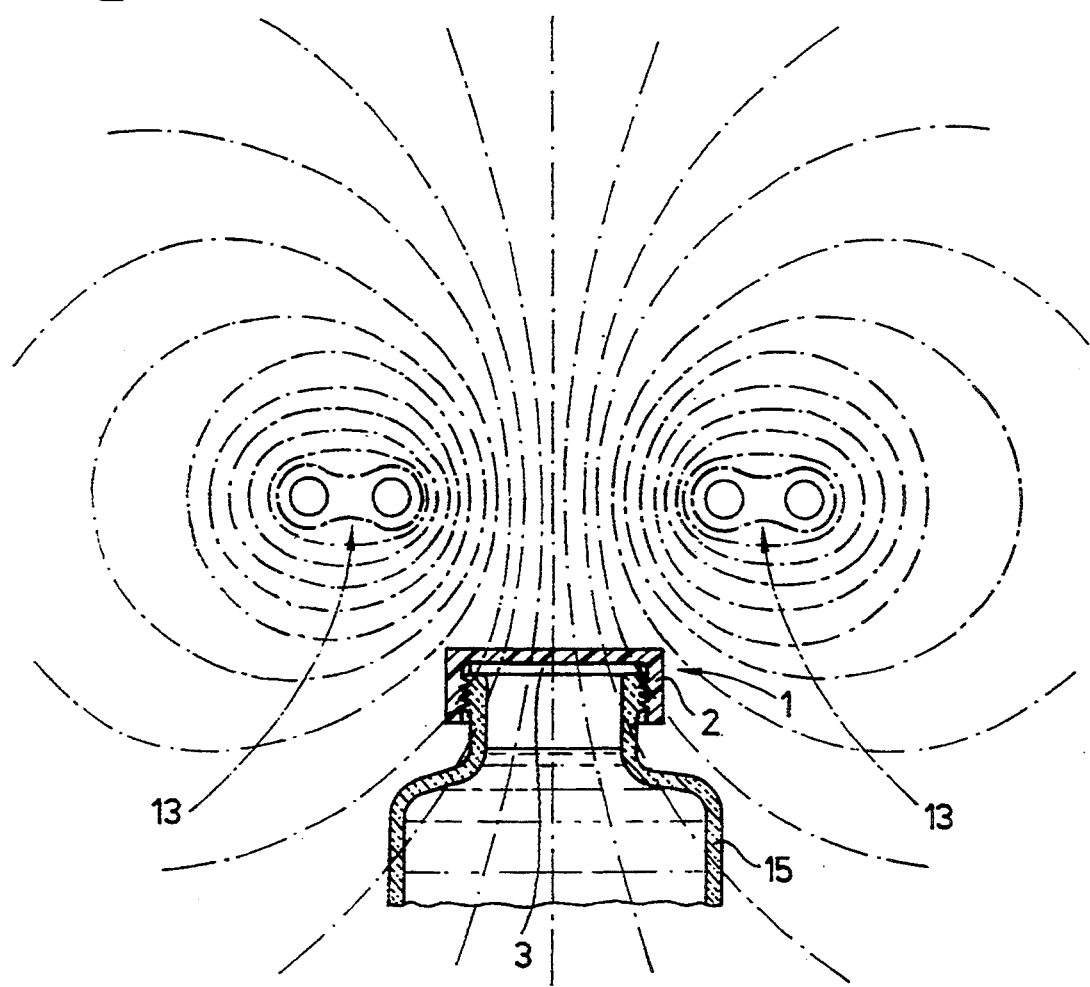

In FIG. 8, L1 represents the sensing coil, (16) in FIG. 6, (and any of the examples shown in FIG. 7), D1 is a semiconductor diode serving as the rectifying device, (17) in FIG. 6, resistor R1 and capacitor C1 represent the integrating circuit, (18) in FIG. 6, and M1 represents a meter, (19) in FIG. 6, to measure the voltage on the capacitor. S1 is a reset switch which shorts out the voltage on the capacitor in preparation for a new measurement.

The values of R1 and C1 are selected so that the voltage generated on C1, (the integral of current through R1 over the duration of the test measurement, divided by the capacitance value) is only a small fraction of the voltage induced in the coil (46). The voltage generated by the integrator is given by the formula, $$V_I = \frac{1}{R1C1} \int_0^t \frac{(V_L - 0.6)}{2} - V_I \cdot dt$$

If $V_I$ (the voltage on the integrator) is small relative to $V_L$ (the voltage from the coil) then the $V_I$ term in the integral can be neglected.

Figure 9:
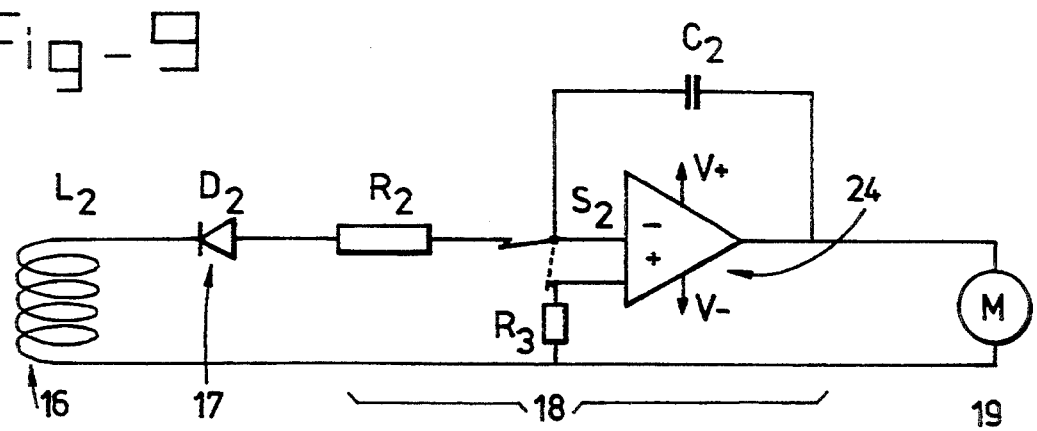
FIG. 9 illustrates an exposure meter comprising an active integrator circuit.

FIG. 9 shows the use of an active integrator circuit in which the output does not need to be limited to small voltages relative to the input voltages. L2 represents the coil (46), D2 is a diode acting as the rectifying device (17), R2 and C2 are basically the same as the integrating device in FIG. 8, except used in conjunction with the operational amplifier (24). The voltage on the capacitor C2 is independent of its own voltage.

$$V_I = \frac{1}{R2C2} \int_0^t \frac{(V_L - 0.6)}{2} - .dt$$

Furthermore, the low impedance output of the operational amplifier imposes no limitations on the voltage indicating device (19). In FIG. 9, switch S2 can be used to reset the exposure meter by discharging the capacitor through resistor R3 shown by the dotted positions of S2.

The operational amplifier (24) must be selected to have an input impedance well in excess of that of the resistor R2.

The voltage generated by the integrating circuit (18) is connected to a voltage indicating device (49). Most conveniently this is a digital voltmeter, but in some applications, other devices may be preferred such as bar-graph displays, analogue meters, recorders or data loggers.

The simple circuit shown in FIG. 8 requires a voltage measuring device with an input impedance well in excess of that of the resistor R1 used in the integrating circuit (18), otherwise the capacitor C1 loses its voltage through the meter. Digital voltmeters and panel meters typically have input impedances of 100 megohms and are well suited for this application.

No such limitation applies to the circuit in FIG. 9, but a digital voltmeter remains a preferred means of accurately displaying the reading from the high frequency magnetic field exposure meter.

There are many constructions possible for the exposure meter of this invention.

Figure 10:
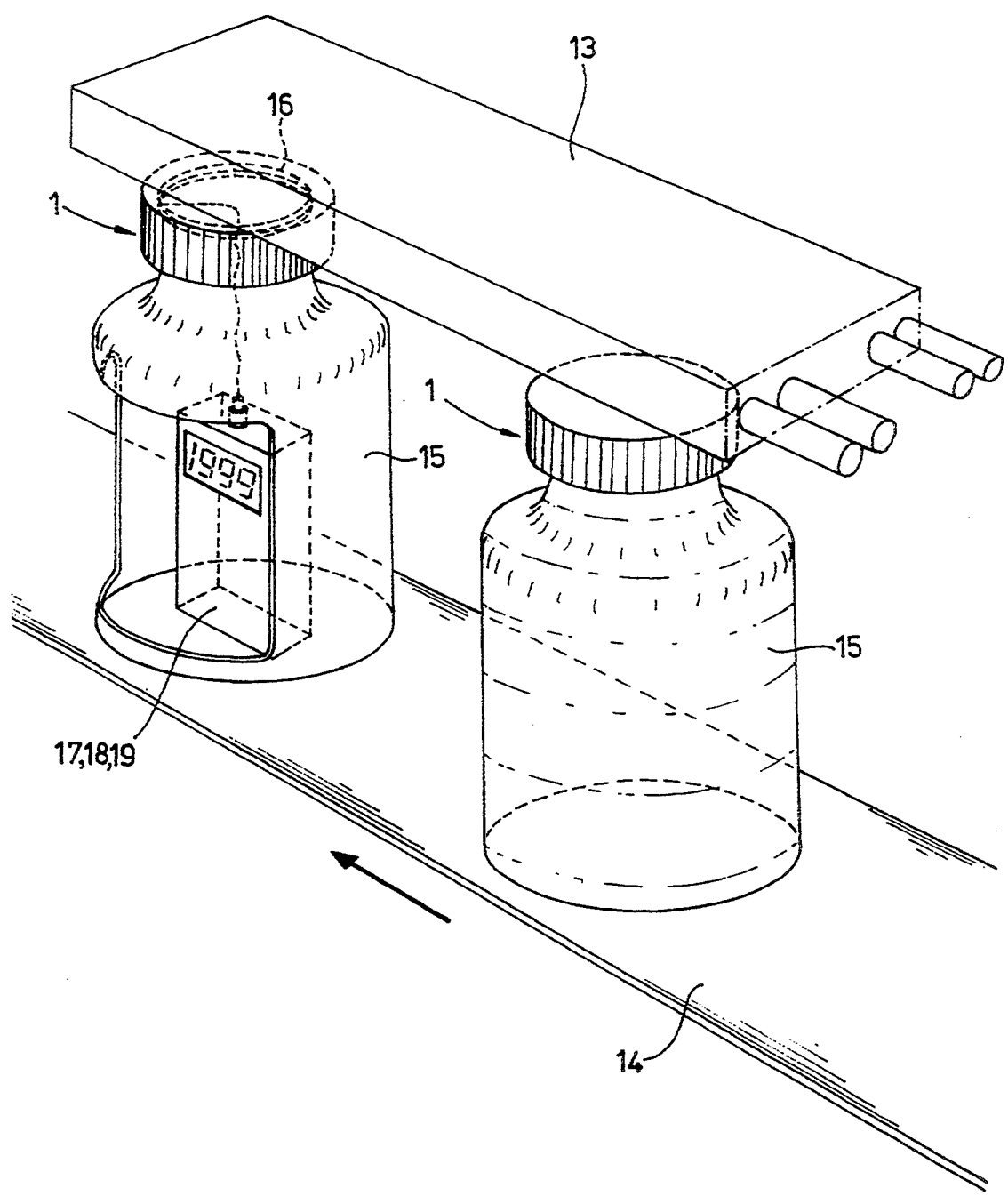
FIG. 10 illustrates one of a number of possible practical constructions.
Figure 11:
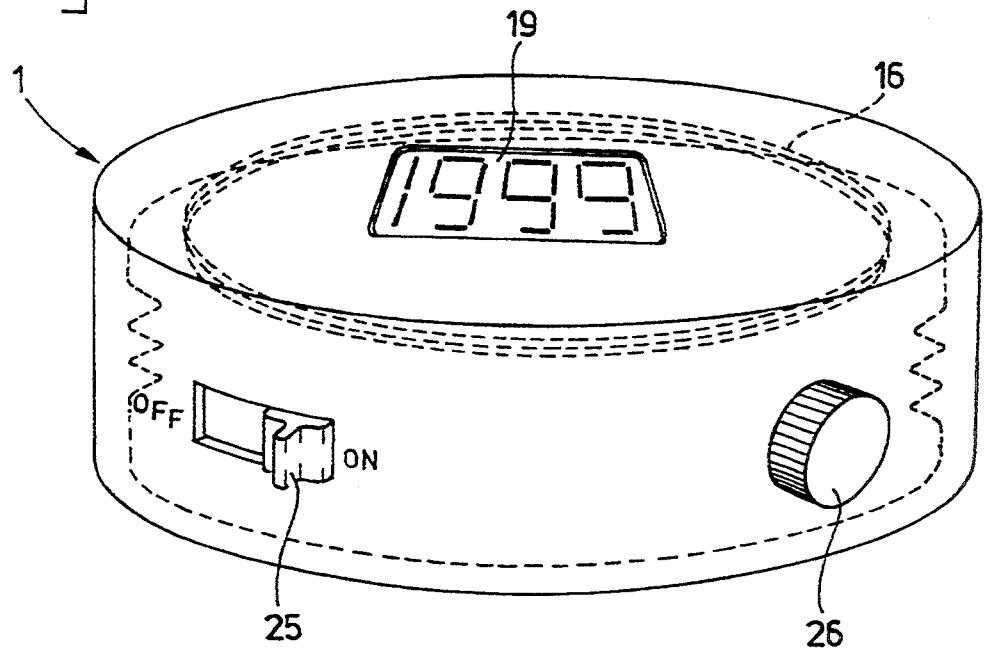
FIG. 11 illustrates another practical construction.

FIG. 10 shows a coil (16), mounted in a closure (1), attached to a bottle to be passed under the induction coil (13) in place of a normal bottle on conveyor (14). A flexible lead from the coil connects it to the enclosed measuring circuit which can be transported attached to or inside a bottle with a cut-out panel as shown.

Where the closures are large enough, it it possible using microcircuit techniques known to those skilled in electronic engineering to build the whole meter coil, rectifier, integrator, and voltage display into a closure as shown in FIG. 11. A circular coil (16) is shown encapsulated in the same plane as a foil membrane (10) would normally be situated, the voltage display (19) is shown and below it is encapsulated the electronic circuit for rectification and integration. The exposure meter, in the form of a closure, incorporates an on-off switch (25) and a reset button (26).

In a further embodiment of the invention, the exposure meter can be switched from its integrating mode to a direct reading mode to give a direct measure of the magnetic field in the position of the sensing coil.

This feature is useful for checking the magnetic field output of the induction coil independently of the power output indicator, FIG. 4 (17) on the induction heater's power supply unit. The feature is also useful on a stationary conveyor for setting the power output and induction coil height to give a previously used h.f. magnetic flux in the position of the closures, and to establish the correct centre line at maximum magnetic flux for the path for the bottles under the induction coil.

Figure 12:
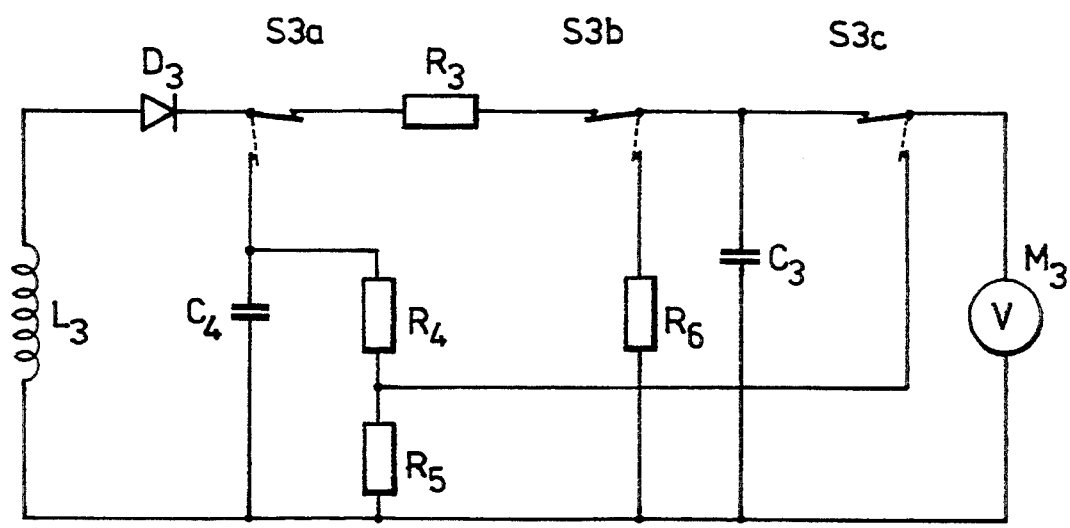
FIG. 12 shows a circuit which combines the exposure meter function with a magnetic field meter function.

FIG. 12 shows a circuit which combines the exposure meter and magnetic field meter functions in the same instrument.

In FIG. 12, in the exposure reading mode, sensing coil L3 is connected via rectifier D3 to integrating circuit R3 and C3, and meter M3 measures the voltage in capacitor C3 which represents the total exposure to the h.f. magnetic field during induction sealing. With the ganged switches S3a, b, c in the dotted positions, the rectified voltage from the coil is smoothed by capacitor C4 and divided by resistors R4 and R5 to produce a suitable reduced voltage to the voltmeter. M3. This voltage represents a measure of the h.f. magnetic flux traversing the sensing coil. The prefered voltage measuring device and indicator is a digital voltmeter. These meters require a battery or other power source to operate. In a further embodiment of the invention, a battery power supply for the meter is replaced by a small power supply circuit which is powered by voltages induced either in the test coil itself or in a separate coil mounted near the test coil. Since the power required to drive a liquid crystal display voltmeter is very small, the extra load on the induction coil is insignificant.

Using the electronic engineering techniques, common on cameras and digital LCD watches, it is perfectly practical to combine a self powered or button battery powered exposure meter, according to this invention, into a closure which can be used for test purposes in place of conventional closures on induction heat sealing operations.

In yet a further embodiment of the invention, the voltage on the integrating circuit (18) which represents the exposure to the h.f. magnetic field is transmitted to a remote indicator or display device or recording device. This could be in a separate instrumentation and control panel or in a controller's office for example, or a recording device used in quality control procedures. Such an embodiment is shown in FIG. 13.

In FIG. 13, the induction heater power supply (12) feeds power to the induction coil (13). The conveyor (14) carries bottles (15) and the exposure meter bottle, having a sensing coil (16) in the closure, beneath the induction coil (13). The sensing coil (16), is connected to the measuring part of the circuit, (17) and (18), which, in this embodiment, transmits the voltage value to an external display device or indicator or recording device shown by (27).

The invention would be used as follows. Once, and once only, for each combination of bottle and closure, the trial and error method would be used to establish a lower working limit, an upper working limit, and a preferred or optimum working setting, for combinations of power setting, working height and conveyor speed. Then for each of these settings, the sensing coil (16), mounted in a closure (1), is attached to the bottle or container being used so that the sensing coil (16) is positioned in the same position and plane as a foil insert (10) in a wad (3) would normally occupy. The coil is connected to the exposure meter which is switched on and reset to read zero. The bottle with exposure meter is placed on the conveyor in place of a normal bottle and the resultant exposure meter reading is recorded for future use. Using the direct field reading option, the h.f. magnetic field output of the induction coil can be read, in a conveniently re-establishable reference position, e.g. with the cap, with the measuring coil, in contact with the centre of the encapsulated induction coil (13). Additionally, the magnetic flux at the sealing position, e.g. in the mid-point of the traverse under the coil, can similarly be recorded for future reference. For future runs, the power to the induction coil can be reset to give the same h.f. magnetic field output, the height of the coil can be reset to give the same magnetic flux in the operating position, and the conveyor speed can be reset to give the same total exposure as found to be optimum in the initial, once only, trial and error testing. Thus much time and materials (containers and contents) are saved in all future setting up operations.

Further it is the intention that the exposure meter of this invention should also be used intermittently during long production runs to check, and if necessary allow adjustment of, operating settings to maintain the correct exposure for good sealing.

In this way, the need for frequent inspection (which is destructive to containers incorporating tamper evident closure rings) is greatly reduced and the efficiency of the operation is greatly improved. The operation of the invention is illustrated by, but in no way limited by, the following examples.

EXAMPLE 1

A sensing coil was used constructed as in FIG. 7, (23). A 60 mm diameter double spiral coil, 5 turns each side, was etched on to a double-sided printed circuit board with the peripheral ends connected through the circuit board, and the centre ends connected to a co-axial screened cable. The sensing coil was mounted in a "63 mm" plastic closure in place of the induction heat seal wad. The coaxial lead connected the coil to a circuit built as shown in FIG. 12, having the following component values:

L3—two times 5 spiral turns overall diameter 60 mm
D3—silicon diode
R3—17 megohms
C3—20 microfarads Time constant (R3×C3) 340 seconds
M3—200 mV $3\frac{1}{2}$ digit LCD panel meter (RS Components type OEM 2μ) input impedance 100 megohms The closure containing the sensing coil was attached to a 5 l. high density polyethylene fluorinated container (supplied by Airopak of Belgium) and test measurements made using an Enercon 2 kW induction heat sealing machine having a "tunnel" (inverted broad U-shaped) induction coil.

The air gap between the encapsulated coil and the test closure was 8 mm and the induction heater was set to an indicated "60%" output power. The operating output frequency was 36 kHz.

In initial trial-and-error sealing trials using Type IHS 705 induction heat sealable wads (from Sonoco Capseal Liners, Slough UK), an exposure time in the coil of 3.5 seconds was found to be Just too low to give a complete seal. The exposure meter, under the same conditions, gave a reading of 600 (representing 60.0 mV on the voltmeter M3). An exposure time of 4.7 seconds was found to be just too high and caused discoloration of the paper although the seal was good. On the exposure meter of this invention, the meter read 800. Adjusting the exposure time to 4.1 seconds, which gave a meter reading of 700, good seals were obtained on the bottles with the closures and type IHS 705 wads.

Thus, for future runs with the same bottles, "63 mm" closures and Type IHS 705 wads, the settings used previously can be fine tuned either with the power setting, working height, or conveyor speed, to give an exposure meter reading of 700. Good sealing conditions are reestablished without the need for further trial-and-error testing.

EXAMPLE 2

The sensing coil was similar to that described in Example 1, but 63 mm in overall diameter, and with ten turns spiralling out from the centre to the edge, connected, through the board, to 10 turns spiralling back in to the centre on the reverse side. This was used in conjunction with the integrating circuit using an operational amplifier as shown in FIG. 9. The operational amplifier was a CMOS type ICL 7611 DCPA having an input impedance of $10^{12}$ ohms, meeting the requirement of being well in excess of the resistance of the resistor R2.

Components in FIG. 9
L2—2 times 10 spiral turns overall diameter 63 mm
D2—silicon diode
R2—100 megohms
C2—0.47 microfarads (low leakage polyester type) Time constant (R2×C2) 47 sec.
Op.Amp—ICL 7611 DCPA driven by ±5 volt d.c. supply
R3—1 k ohm (shorting resistor)
M—voltage indicating device was a potentiometric chart recorder, plus a digital hand-held multi-meter The sensing coil was positioned in the same position as a closure wad would occupy beneath the same Enercon induction heat sealing coil as used in Example 1. At a 50% indicated power output setting on the induction heat sealer, the chart recorder showed the exposure to the h.f. magnetic field accumulating at the rate of 200 mV per second, requiring 2.5 seconds to reach an indicated exposure of 500. With the power output set higher to an indicated 68%, the chart recorder showed the exposure to accumulate at 263 units (here millivolts) per second. At this setting, 1.9 seconds was necessary to achieve the same exposure of 500.

EXAMPLE 3

This example illustrates the use of the invention not only to measure exposure, but also in its non-integrating mode, to monitor induction coil output and magnetic flux in the working position of the closure during an induction heat sealing operation.

The sensing coil comprised 5 closely packed turns of wire having a diameter of 60 mm as shown in FIG. 7, (20). The sensing coil was mounted in a "63 mm" plastic closure in place of the heat sealable wad. The closure was attached to a 5 l. plastic container. This sensing coil was used in a circuit as shown in FIG. 12.

Components
L3—5 turns 60 mm diameter
D3—silicon diode
R3—100 megohms
C3—10 microfarads Time constant (R3×C3) 1000 sec.
M3—200 mV liquid crystal display panel meter, 100 megohms input impedance
C4—0.01 microfarads
R4—39 000 ohms
R5—220 ohms
R6—1000 ohms The meter was used in conjunction with the same 2 kW Enercon induction heat sealing machine and induction coil as in the previous examples. In this example, the bottle with test coil was tested static at a spacing of 30 mm between induction coil surface and the closure holding the sensing coil. The effect of changing the output power to the induction coil was observed on:
(i) the h.f. magnetic field output, measured with no spacing between closure and coil and with the meter in the magnetic field measuring mode;
(ii) the h.f. magnetic flux in the "working" position of the closure with the 30 mm spacing and the meter in the magnetic field measuring mode;
(iii) the rate of accumulating exposure to the h.f. magnetic field in the "working" position with the meter in its integrating exposure meter mode.

The following readings (mV×10) were made.

| Indicated machine power | 52% | 70% | 90% |
| --- | --- | --- | --- |
| H.f. magnetic field strength | 869 | 1153 | 1459 |
| H.f. magnetic flux at 30 mm | 245 | 385 | 488 |
| Rate of exposure (units/sec) | 17.1 | 24.2 | 34.2 |

This data can be used to reset machine operations. For example, the power output from the coil can be reset to produce the same h.f. magnetic field strength as, for example, in the 70% setting by adjusting the power to give a magnetic field reading of 1153, rather than relying on the indirect indication represented by the machine's output power meter. The working height can be adjusted to give a reading for the flux at the closure position of 385 on the meter. This is the most important parameter as it determines the heat energy generated in wads by induction heating.

The final setting of conveyor speed determines the total exposure to the h.f magnetic field, and is set using the exposure meter in its integrating mode to give an exposure reading established by previous trials to give good sealing.

Such measurements made on the exposure meter provide an accurate record of the processing conditions for quality control purposes in a way that was hitherto not possible.

I claim:

1. A high frequency magnetic field exposure meter suitable for use in an induction heat sealing process for heat sealing the metal foil wad elements in a closure to a container to be closed by said closure, during which operation each closure passes beneath an induction coil of an induction heat sealing apparatus, said meter comprising:

a magnetic field sensing coil designed to be exposed to the same h.f. magnetic flux as said metal foil wad elements of said closures receive during the induction heat sealing operation;

a rectifier to convert the a.c. output from said coil to a d.c. output;

an integrating circuit to accumulate said d.c. output over an exposure period equal to the exposure period in which the metal foil is sealed to the container during normal operation of the apparatus;

a display device to indicate the accumulated value generated by said integrating circuit.

2. The exposure meter according to claim 1, further comprising a planar sensing coil of the same outer diameter as a metal foil wad and mounted in a closure in place of a heat sealable wad.

3. The exposure meter according to claim 2, wherein said planar coil is in the form of a spiral of the same outside diameter as a heat sealable wad.

4. The exposure meter according to claim 1, wherein said coil is in the form of a single-sided or double-sided printed circuit board.

5. The exposure meter according to claim 4, wherein the circuit board is a flexible foil.

6. The exposure meter according to claim 1, wherein a complete meter is built into a bottle closure interchangeable with bottle closures being used in the induction heat sealing operation.

7. The exposure meter according to claim 1, wherein said meter is switchable to a magnetic field measuring mode for use in checking the induction coil outputs and in checking the magnetic flux received in working path through the h.f magnetic field from the induction coil.

8. The exposure meter according to claim 1, wherein said integrating circuit further comprises a high resistor through which current flows to charge a capacitor.

9. The exposure meter according to claim 1, wherein exposure to the high frequency induction sealing coil provides an electrical power necessary to operate said meter and said display device.

10. The exposure meter according to claim 9, wherein said meter transmits by wireless techniques a measured exposure value to at least one of a remote display, a reading device, and a recording device.

* * * * *